United States Patent
Ikeda et al.

(10) Patent No.: US 10,608,009 B2
(45) Date of Patent: Mar. 31, 2020

(54) PERIPHERAL STRUCTURE FOR NAND FLASH MEMORY DEVICE

(71) Applicant: Toshiba Memory Corporation, Minato-ku (JP)

(72) Inventors: Keiji Ikeda, Kawasaki (JP); Masumi Saitoh, Yokkaichi (JP); Hideaki Aochi, Yokkaichi (JP); Takeshi Kamigaichi, Yokkaichi (JP); Jun Fujiki, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/067,830

(22) Filed: Mar. 11, 2016

(65) Prior Publication Data

US 2016/0268304 A1    Sep. 15, 2016

(30) Foreign Application Priority Data

Mar. 13, 2015 (JP) ................................ 2015-051118

(51) Int. Cl.
*H01L 27/11582* (2017.01)
*H01L 27/11573* (2017.01)
*H01L 27/1157* (2017.01)

(52) U.S. Cl.
CPC .... *H01L 27/11582* (2013.01); *H01L 27/1157* (2013.01); *H01L 27/11573* (2013.01)

(58) Field of Classification Search
CPC ......... H01L 27/11526; H01L 27/11573; H01L 23/528; H01L 27/11551; H01L 27/1151;

(Continued)

(56) References Cited

U.S. PATENT DOCUMENTS 7,847,334 B2 * 12/2010 Katsumata ............ H01L 21/764
 257/314
7,852,675 B2 12/2010 Maejima
(Continued)

FOREIGN PATENT DOCUMENTS

JP 7-249745 A 9/1995
JP 2009-266944 A 11/2009
(Continued)

OTHER PUBLICATIONS

John F. Wager, et al. "An amorphous oxide semiconductor thin-film transistor route to oxide electronics," Current Opinion in Solid State and Material Science 18 (2014) 53-61, available only Jul. 26, 2013.*
(Continued)

*Primary Examiner* — Cuong Q Nguyen
*Assistant Examiner* — Shih Tsun A Chou
(74) *Attorney, Agent, or Firm* — Oblon, McClelland, Maier & Neustadt, L.L.P.

(57) ABSTRACT

This nonvolatile semiconductor memory device comprises: a memory cell array including memory cells; and a wiring line portion connecting the memory cell array to an external circuit. The memory cell array comprises a plurality of first conductive layers which are connected to the memory cells and arranged in a stacking direction. On the other hand, the wiring line portion comprises: a plurality of second conductive layers arranged in the stacking direction and respectively connected to the plurality of first conductive layers, positions of ends of the plurality of second conductive layers being different in a first direction crossing the stacking direction; a third conductive layer extending in the stacking direction from the second conductive layer; a channel semiconductor layer connected to one end of the third conductive layer; and a gate electrode wiring line disposed on a surface of the channel semiconductor layer via a gate insulating film.

7 Claims, 13 Drawing Sheets

(58) Field of Classification Search
CPC ......... H01L 27/11524; H01L 27/11529; H01L 27/1157; H01L 27/11582; H01L 27/11578
See application file for complete search history.

(56) References Cited

U.S. PATENT DOCUMENTS

| | | | | |
|---|---|---|---|---|
| 8,068,364 | B2* | 11/2011 | Maejima | G11C 5/02 365/185.05 |
| 8,441,059 | B2* | 5/2013 | Sim | H01L 27/11526 257/324 |
| 8,644,046 | B2* | 2/2014 | Seol | G11C 16/0408 365/51 |
| 8,876,003 | B2 | 7/2014 | Iwase et al. | |
| 8,952,482 | B2* | 2/2015 | Tanzawa | H01L 27/11531 257/499 |
| 8,969,867 | B2* | 3/2015 | Yamazaki | H01L 29/7869 257/43 |
| 9,053,977 | B2* | 6/2015 | Choi | H01L 29/66833 |
| 9,543,318 | B1* | 1/2017 | Lu | H01L 27/11582 |
| 9,595,535 | B1* | 3/2017 | Ogawa | H01L 27/11582 |
| 9,786,683 | B1* | 10/2017 | Sakuma | H01L 27/11582 |
| 9,929,166 | B1* | 3/2018 | Sakuma | H01L 29/792 |
| 10,056,150 | B2* | 8/2018 | Ikeda | H01L 27/11568 |
| 2007/0069334 | A1* | 3/2007 | Beach | H01L 23/5228 257/536 |
| 2009/0310425 | A1* | 12/2009 | Sim | H01L 27/11526 365/185.29 |
| 2011/0063910 | A1* | 3/2011 | Maejima | G11C 5/02 365/185.11 |
| 2011/0240998 | A1* | 10/2011 | Morosawa | H01L 29/41733 257/57 |
| 2012/0108048 | A1 | 5/2012 | Lim et al. | |
| 2012/0119287 | A1* | 5/2012 | Park | H01L 27/11519 257/329 |
| 2012/0181602 | A1* | 7/2012 | Fukuzumi | H01L 27/0688 257/326 |
| 2012/0248432 | A1* | 10/2012 | Noda | H01L 21/02472 257/43 |
| 2013/0056816 | A1* | 3/2013 | Iwase | H01L 27/0738 257/316 |
| 2013/0113033 | A1* | 5/2013 | Choi | H01L 29/66833 257/324 |
| 2015/0236038 | A1* | 8/2015 | Pachamuthu | H01L 27/11582 257/326 |
| 2016/0181269 | A1* | 6/2016 | Lai | H01L 27/11578 257/326 |
| 2017/0186770 | A1* | 6/2017 | Or-Bach | H01L 27/11582 |

FOREIGN PATENT DOCUMENTS

| | | |
|---|---|---|
| JP | 2009-283498 A | 12/2009 |
| JP | 2012-146661 A | 8/2012 |
| JP | 2012-248823 A | 12/2012 |
| JP | 2013-55142 A | 3/2013 |
| JP | 2013-201293 A | 10/2013 |
| JP | 2014-524672 A | 9/2014 |

OTHER PUBLICATIONS

M.-J. Lee et al, Tech. Dig. of IEDM pp. 85-88, Stack Friendly All-Oxide 3D RRAM using GaInZnO Peripheral TFT realized over Glass Substrates; 2008.

* cited by examiner

PERIPHERAL STRUCTURE FOR NAND FLASH MEMORY DEVICE

CROSS-REFERENCE TO RELATED APPLICATIONS

This application is based upon and claims the benefit of priority from the prior Japanese Patent Application No. 2015-51118, filed on Mar. 13, 2015, the entire contents of which are incorporated herein by reference.

FIELD

Embodiments described below relate to a nonvolatile semiconductor memory device.

BACKGROUND

In recent years, a three-dimensional type nonvolatile semiconductor memory device has been attracting attention as a nonvolatile semiconductor memory device for achieving a higher degree of integration without being limited by a resolution limit of lithography technology. For example, the following device has been proposed as a three-dimensional type NAND type flash memory, namely, a device comprising: a stacked body having stacked alternately therein on a semiconductor substrate a plurality of conductive films and inter-layer insulating films, the conductive films functioning as a word line or a select gate line; and a semiconductor layer formed so as to penetrate this stacked body. This semiconductor layer functions as a body of a memory string, and there is at least a memory gate insulating layer formed between the semiconductor layer and the conductive film, the memory gate insulating layer including a charge accumulation layer.

This kind of three-dimensional type NAND type flash memory comprises a stepped wiring line portion where the stacked conductive films are formed in steps, for connection to a peripheral circuit. Moreover, a multiplicity of contact plugs are formed so as to extend in a stacking direction from those stepped conductive films. A memory cell array is connected to an external peripheral circuit via these contact plugs and the likes of a higher layer wiring line.

However, the stepped wiring line portion of a conventional three-dimensional type NAND type flash memory has an area that ends up increasing as a stacking number of the memory increases, this leading to an increase in area of a memory chip. Moreover, the increase in stacking number results in the peripheral circuit also increasing in size, and this also leads to an increase in area of the memory chip.

DETAILED DESCRIPTION

A nonvolatile semiconductor memory device according to an embodiment described below comprises: a memory cell array including memory cells; and a wiring line portion connecting the memory cell array to an external circuit. The memory cell array comprises a plurality of first conductive layers. The plurality of first conductive layers are connected to the memory cells and arranged in a stacking direction. On the other hand, the wiring line portion comprises: a plurality of second conductive layers arranged in the stacking direction and respectively connected to the plurality of first conductive layers, positions of ends of the plurality of second conductive layers being different in a first direction crossing the stacking direction; a third conductive layer extending in the stacking direction from the second conductive layer; a channel semiconductor layer connected to one end of the third conductive layer; and a gate electrode layer disposed on a surface of the channel semiconductor layer via a gate insulating film.

Next, nonvolatile semiconductor memory devices according to embodiments of the invention will be described in detail with reference to the drawings.

First Embodiment

Figure 1:
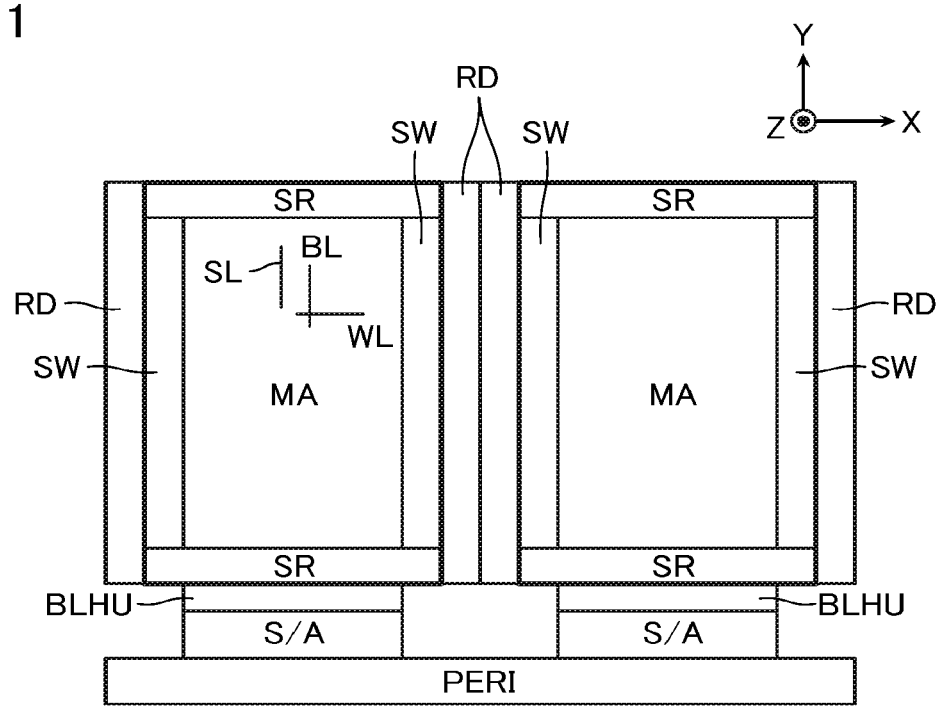
FIG. 1 is a block diagram showing a schematic configuration of a NAND type flash memory according to a first embodiment.

First, a NAND type flash memory according to a first embodiment will be described with reference to FIG. 1, and so on. As shown in FIG. 1, this NAND type flash memory of the first embodiment comprises a memory cell array MA.

Moreover, this NAND type flash memory comprises the following in a periphery of the memory cell array MA, namely, a row decoder RD, a word line connection circuit SW, a bit line connection circuit BLHU, a sense amplifier circuit S/A, and a peripheral circuit PERI.

The memory cell array MA has memory cells arranged three-dimensionally therein, as will be mentioned later. In addition, the memory cell array MA comprises: a plurality of word lines WL that extend having as their longitudinal direction an X direction of FIG. 1; and a plurality of bit lines BL and a source line SL that extend having as their longitudinal direction a Y direction of FIG. 1. The plurality of word lines WL are stacked in a stacking direction in the memory cell array MA. The plurality of word lines WL are respectively connected to different memory cells MC arranged in the stacking direction in the memory cell array MA.

Figure 2:
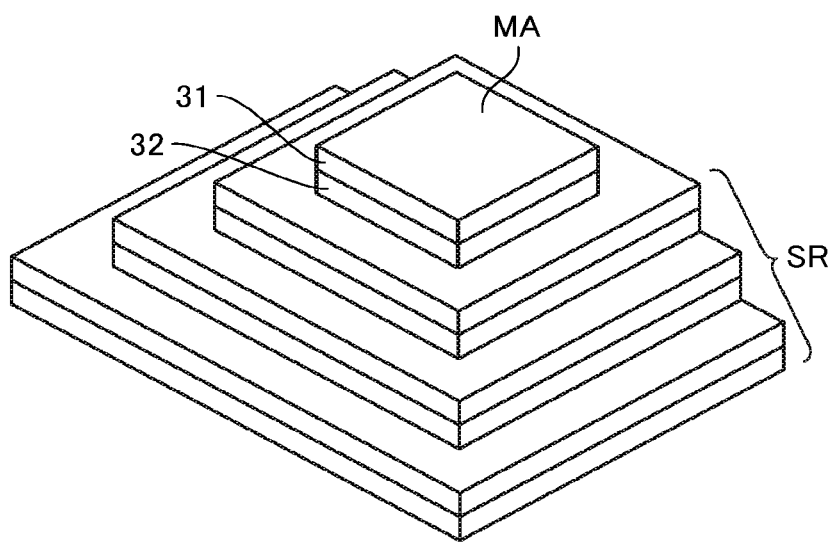
FIG. 2 is a perspective view showing a schematic configuration of a memory cell array MA and a stepped wiring line portion SR.

Moreover, formed in the periphery of this memory cell array MA is a stepped wiring line portion SR for connecting the word line WL to an external circuit. As shown in FIG. 2, this stepped wiring line portion SR comprises lead-out wiring lines connected to identical layers as the word lines WL, and these lead-out wiring lines are formed in steps. The stepped wiring line portion SR is formed by etching stacked conductive layers and inter-layer insulating films while performing isotropic slimming processing of a resist, by a well-known method. Therefore, as shown in FIGS. 1 and 2, the stepped wiring line portion SR is usually formed so as to surround the memory cell array MA on all sides.

The row decoder RD selects the plurality of word lines WL and supplies a voltage required in an operation. Moreover, the word line connection circuit SW is a switching circuit for connecting the word line WL and the row decoder RD, and comprises a multiplicity of transistors connecting the word line WL and the row decoder RD. As will be mentioned later, the transistors configuring this word line connection circuit SW are disposed above the stepped wiring line portion SR so as to overlap the stepped wiring line portion SR in an XY plane.

Furthermore, the sense amplifier circuit S/A and the bit line connection circuit BLHU are disposed in the Y direction of the stepped wiring line portion SR. The sense amplifier circuit S/A is connected to the bit line BL via the bit line connection circuit BLHU and provides the bit line BL with a voltage for write, and has a function of detecting and amplifying a potential that has appeared in the bit line BL during read. The bit line connection circuit BLHU includes a transistor that controls connection between the bit line BL and the sense amplifier circuit S/A. The peripheral circuit PERI includes circuits other than those mentioned above, for example, a power supply circuit, a charge pump circuit (booster circuit), a data register, and so on.

Figure 3:
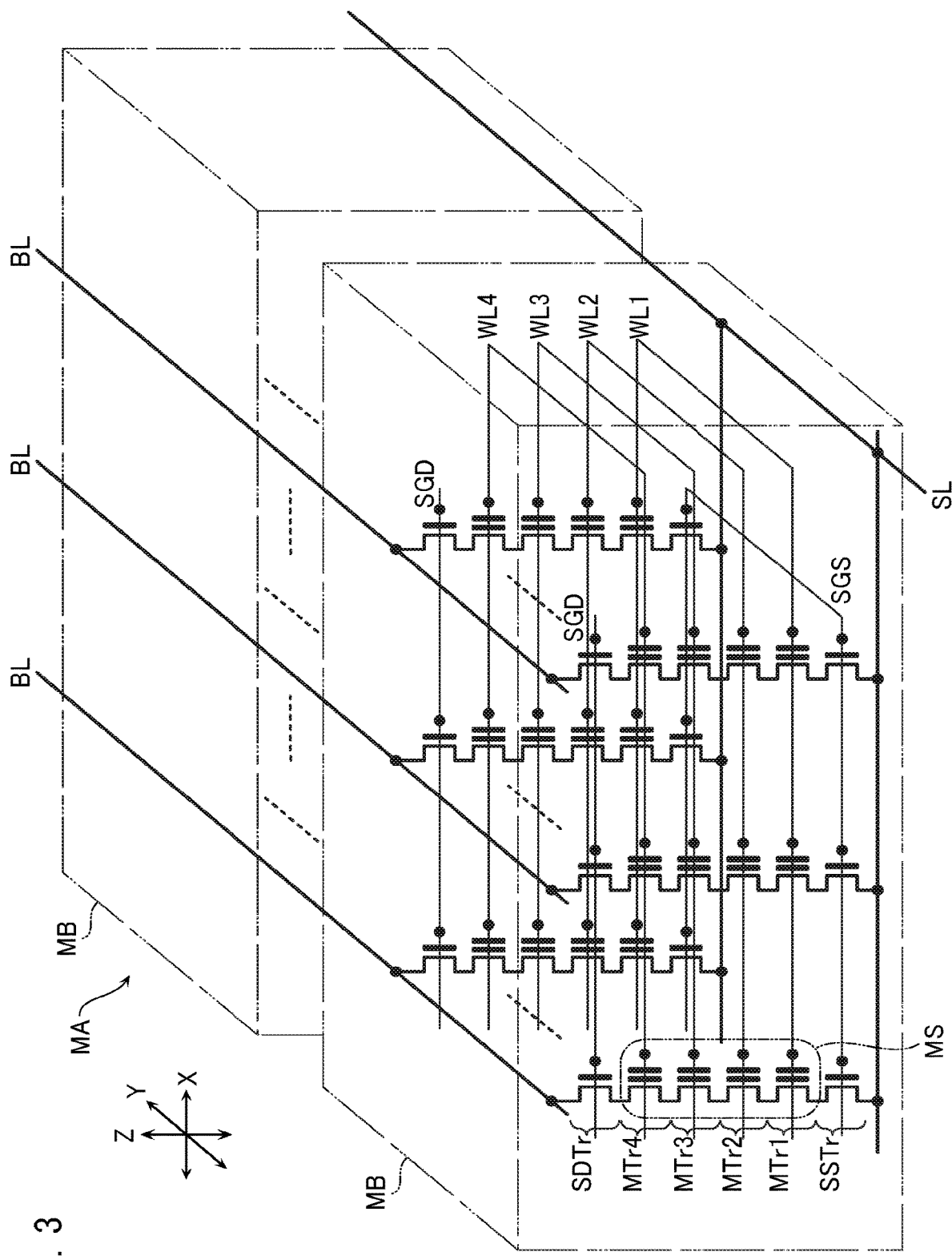
FIG. 3 is a circuit diagram explaining a circuit configuration of the memory cell array MA.

Next, a circuit configuration of the memory cell array MA will be described. FIG. 3 is a circuit diagram of the memory cell array MA. Note that a structure of the memory cell array MA shown in this FIG. 3 is merely one example. A later-mentioned structure of the word line connection circuit SW may of course be applied also to a variety of three-dimensional type memory cell arrays other than that illustrated.

As shown in FIG. 3, the memory cell array MA includes a plurality of memory blocks MB. The memory blocks MB are arranged in the Y direction on a semiconductor substrate Ba (not illustrated).

As shown in FIG. 3, the memory block MB comprises a plurality of memory strings MS, source side select transistors SSTr, and drain side select transistors SDTr. The memory string MS is configured by memory transistors (memory cells) MTr1 to MTr4 connected in series. For simplification of explanation, the illustrated example describes an example where one memory string MS includes four memory transistors MTr, but the present invention is not limited to this configuration, and one memory string MS may of course include a larger number of memory transistors.

The drain side select transistor SDTr is connected to one end (memory transistor MTr4) of the memory string MS. The source side select transistor SSTr is connected to the other end (memory transistor MTr1) of the memory string MS. For example, the memory strings MS are provided in a matrix in the XY plane over a plurality of rows and plurality of columns, every one memory block MB.

As shown in FIG. 3, in the memory block MB, control gates of the memory transistors MTr1 arranged in a matrix are commonly connected to a word line WL1. Similarly, control gates of the memory transistors MTr2 are commonly connected to a word line WL2. Control gates of the memory transistors MTr3 are commonly connected to a word line WL3. Control gates of the memory transistors MTr4 are commonly connected to a word line WL4.

As shown in FIG. 3, in the memory block MB, control gates of each of the drain side select transistors SDTr arranged in a line in the X direction are commonly connected to a drain side select gate line SGD. A plurality of the drain side select gate lines SGD are provided with a certain pitch in the Y direction in one memory block MB. Moreover, other ends of the drain side select transistors SDTr arranged in a line in the Y direction are commonly connected to the bit line BL. The bit line BL is formed so as to extend in the Y direction straddling the memory block MB. A plurality of the bit lines BL are provided in the X direction.

As shown in FIG. 3, in one memory block MB, control gates of all of the source side select transistors SSTr are commonly connected to a source side select gate line SGS. Moreover, other ends of the source side select transistors SSTr arranged in a line in the Y direction are commonly connected to the source line SL.

Figure 4:
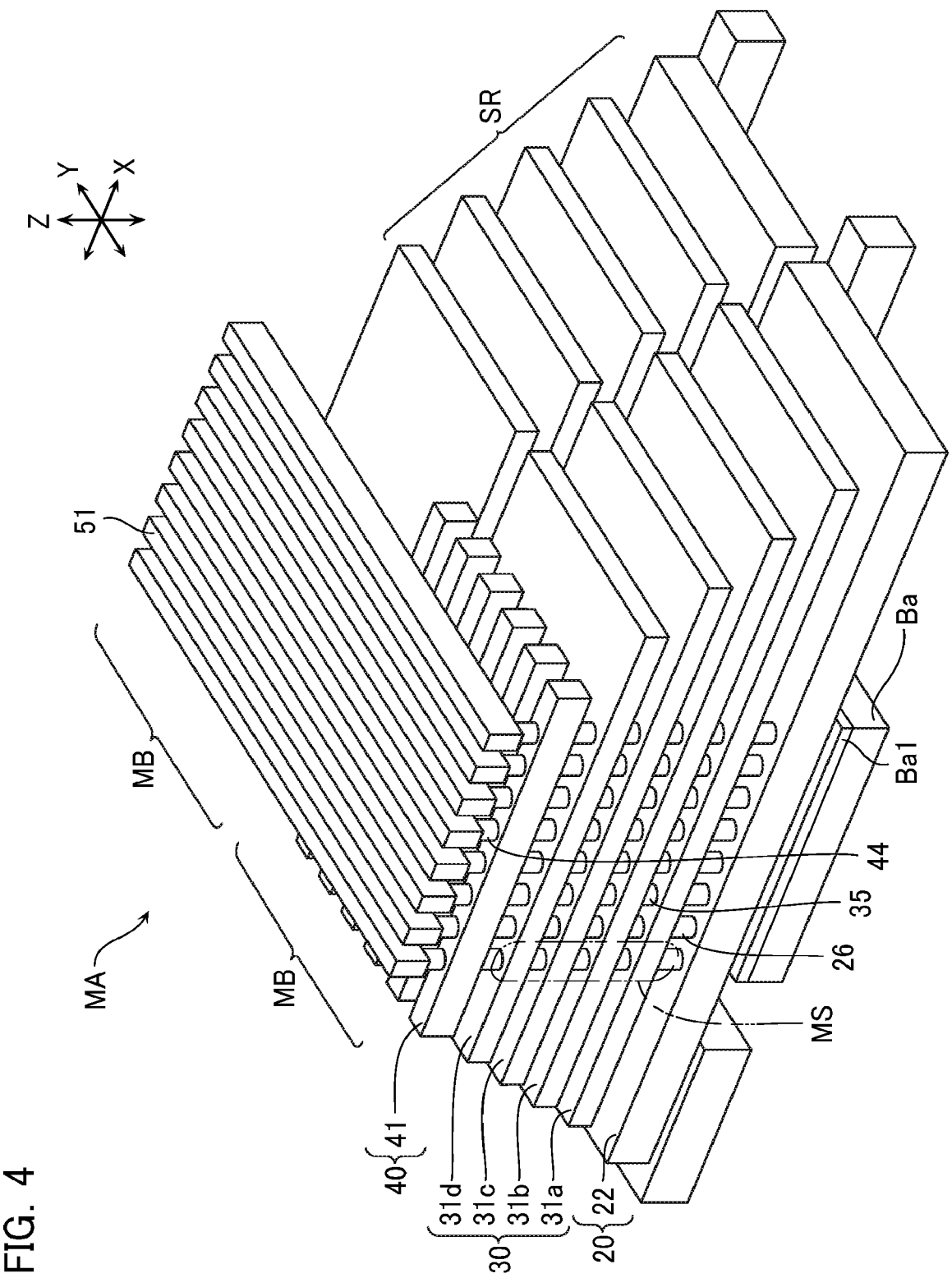
FIG. 4 is a schematic perspective view of the memory cell array MA.
Figure 5:
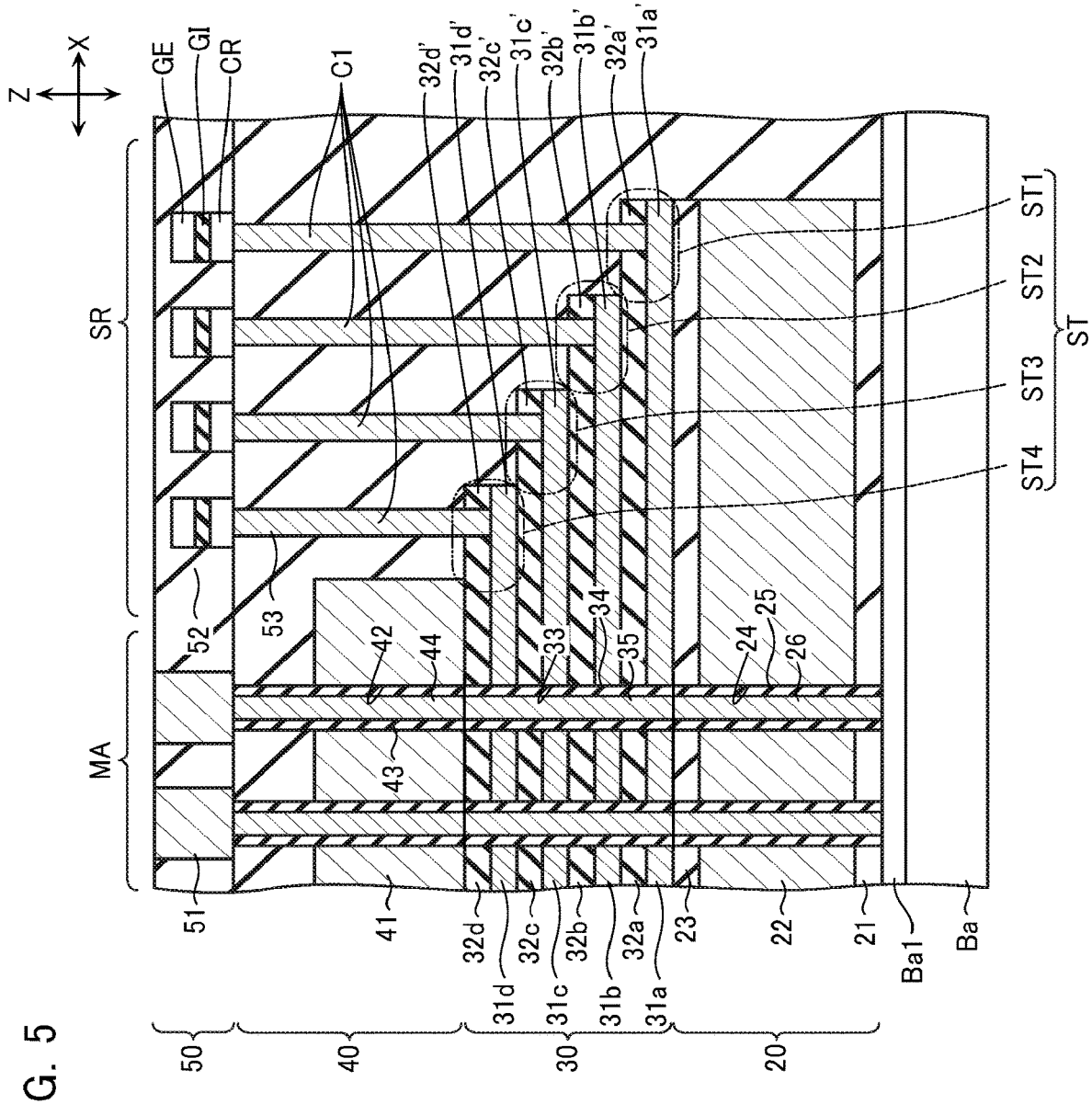
FIG. 5 is a cross-sectional view of the memory cell array MA and the stepped wiring line portion SR.

A circuit configuration of the above-described kind of memory cell array MA is achieved by a stacked structure shown in FIGS. 4 and 5. FIG. 4 is a schematic perspective view of the memory cell array MA. FIG. 5 is a cross-sectional view of the memory cell array MA and the stepped wiring line portion SR.

As shown in FIGS. 4 and 5, the memory cell array MA includes a source side select transistor layer 20, a memory transistor layer 30, a drain side select transistor layer 40, and a wiring line layer 50 that are stacked sequentially on the semiconductor substrate Ba, on a memory block MB basis.

The source side select transistor layer 20 is a layer that functions as the source side select transistor SSTr. The memory transistor layer 30 is a layer that functions as the memory string MS (memory transistors MTr1 to MTr4). The drain side select transistor layer 40 is a layer that functions as the drain side select transistor SDTr. The wiring line layer 50 is a layer that functions as various kinds of wiring lines.

As shown in FIGS. 4 and 5, the source side select transistor layer 20 includes a source side first insulating layer 21, a source side conductive layer 22, and a source side second insulating layer 23 that are formed sequentially on the semiconductor substrate Ba. The source side conductive layer 22 is formed so as to extend two-dimensionally (in a plate shape) in the X direction and the Y direction over the memory block MB.

The source side first insulating layer 21 and the source side second insulating layer 23 are configured by, for example, silicon oxide (SiO$_2$). The source side conductive layer 22 is configured by, for example, polysilicon (p-Si). Moreover, as shown in FIG. 4, the source side select transistor layer 20 includes a source side hole 24 formed so as to penetrate the source side first insulating layer 21, the source side conductive layer 22, and the source side second insulating layer 23. The source side holes 24 are formed in a matrix in the X direction and the Y direction.

Furthermore, as shown in FIG. 5, the source side select transistor layer 20 includes a source side gate insulating layer 25 and a source side columnar semiconductor layer 26 that are formed sequentially on a sidewall facing the source side hole 24. The source side gate insulating layer 25 is formed with a certain thickness on the sidewall facing the source side hole 24. The source side columnar semiconductor layer 26 is formed so as to fill the source side hole 24. The source side columnar semiconductor layer 26 is formed in a column shape extending in the stacking direction. An upper surface of the source side columnar semiconductor layer 26 is formed so as to contact a lower surface of a later-mentioned columnar semiconductor layer 35. The source side columnar semiconductor layer 26 is formed on a diffusion layer Ba1 on the semiconductor substrate Ba. The diffusion layer Ba1 functions as the source line SL.

The source side gate insulating layer 25 is configured by, for example, silicon oxide (SiO$_2$). The source side columnar semiconductor layer 26 is configured by, for example, polysilicon (p-Si).

In the above-described configuration of the source side select transistor layer 20, the source side conductive layer 22 functions as the control gate of the source side select transistor SSTr and as the source side select gate line SGS.

Moreover, as shown in FIGS. 4 and 5, the memory transistor layer 30 includes first through fourth word line conductive layers 31a to 31d (first conductive layers) and first through fourth inter-word line insulating layers 32a to 32d that are stacked sequentially on the source side select transistor layer 20. The first through fourth word line conductive layers 31a to 31d and first through fourth inter-word line insulating layers 32a to 32d are formed so as to extend two-dimensionally (in a plate shape) in the X direction and the Y direction. The first through fourth word line conductive layers 31a to 31d and first through fourth inter-word line insulating layers 32a to 32d are divided on a memory block MB basis.

In addition, as shown in FIG. 5, the memory transistor layer 30 includes a memory hole 33 formed so as to penetrate the first through fourth word line conductive layers 31a to 31d and the first through fourth inter-word line insulating layers 32a to 32d. The memory holes 33 are formed in a matrix in the X direction and the Y direction. The memory hole 33 is formed at a position aligned with the source side hole 25.

Figure 6:
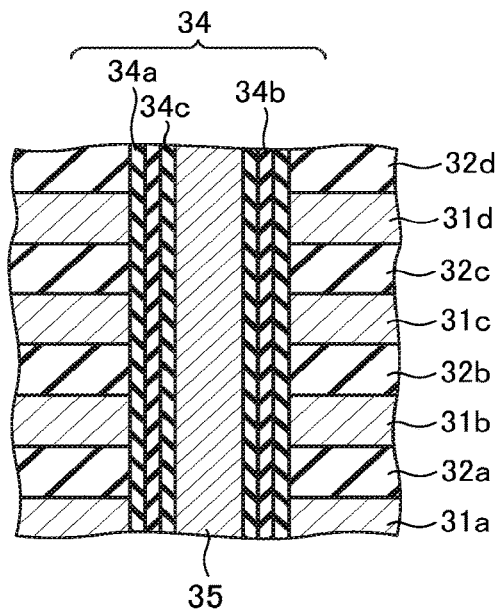
FIG. 6 is a cross-sectional view showing details of a structure of a memory transistor layer 30.

Furthermore, as shown in FIG. 6, the memory transistor layer 30 includes a block insulating layer 34a, a charge accumulation layer 34b, a tunnel insulating layer 34c, and the columnar semiconductor layer 35 that are formed sequentially on a sidewall facing the memory hole 33.

As shown in FIG. 6, the block insulating layer 34a is formed with a certain thickness on the sidewall facing the memory hole 33. The charge accumulation layer 34b is formed with a certain thickness on a sidewall of the block insulating layer 34a. The tunnel insulating layer 34c is formed with a certain thickness on a sidewall of the charge accumulation layer 34b. The columnar semiconductor layer 35 is formed so as to fill the memory hole 33. The columnar semiconductor layer 35 is formed in a column shape so as to extend in the stacking direction. The lower surface of the columnar semiconductor layer 35 is formed so as to contact the upper surface of the source side columnar semiconductor layer 26. Moreover, an upper surface of the columnar semiconductor layer 35 is formed so as to contact a lower surface of a later-mentioned drain side columnar semiconductor layer 44. Note that the columnar semiconductor layer 35 may be configured having an insulating film core at its center. Note that the block insulating layer 34a and the tunnel insulating layer 34c are configured by, for example, silicon oxide (SiO$_2$). The charge accumulation layer 34b is configured by, for example, silicon nitride (SiN). The columnar semiconductor layer 35 is configured by, for example, polysilicon (p-Si).

In the above-described configuration of the memory transistor layer 30, the first through fourth word line conductive layers 31a to 31d function as the control gates of the memory transistors MTr1 to MTr4 and as the word lines WL1 to WL4.

As shown in FIGS. 4 and 5, the drain side select transistor layer 40 includes a drain side conductive layer 41 stacked on the memory transistor layer 30. The drain side conductive layer 41 is formed directly above where the columnar semiconductor layer 35 is formed. The drain side conductive layers 41 are formed in stripes that extend having the X direction as their longitudinal direction and with a certain pitch in the Y direction. The drain side conductive layer 41 is configured by, for example, polysilicon (p-Si).

Moreover, as shown in FIG. 5, the drain side select transistor layer 40 includes a drain side hole 42 formed so as to penetrate the drain side conductive layer 41. The drain side holes 42 are formed in a matrix in the X direction and the Y direction. The drain side hole 42 is formed at a position aligned with the memory hole 33.

Furthermore, as shown in FIG. 5, the drain side select transistor layer 40 includes a drain side gate insulating layer 43 and the drain side columnar semiconductor layer 44 that are formed sequentially on a sidewall facing the drain side hole 42. The drain side gate insulating layer 43 is formed with a certain thickness on the sidewall facing the drain side hole 42. The drain side columnar semiconductor layer 44 is formed so as to fill the drain side hole 42. The drain side columnar semiconductor layer 44 is formed in a column shape so as to extend in the stacking direction. The lower surface of the drain side columnar semiconductor layer 44 is formed so as to contact the upper surface of the columnar semiconductor layer 35. Note that the drain side gate insulating layer 43 is configured by, for example, silicon oxide (SiO$_2$). The drain side columnar semiconductor layer 44 is configured by, for example, polysilicon (p-Si). The drain side conductive layer 41 functions as the control gate of the drain side select transistor SDTr and as the drain side select gate line SGD.

As shown in FIG. 5, the wiring line layer 50 includes the likes of a first wiring line layer 51, a channel semiconductor layer CR, a gate insulating film GI, and a gate electrode layer GE.

The first wiring line layer 51 is formed so as to contact an upper surface of the drain side columnar semiconductor layer 44. The first wiring line layers 51 are formed with a certain pitch in the X direction so as to extend in the Y direction. The first wiring line layer 51 functions as the bit line BL.

Moreover, the channel semiconductor layer CR, the gate insulating film GI, and the gate electrode layer GE are members configuring a transistor in the previously mentioned word line connection circuit SW. The channel semiconductor layer CR functions as a channel region of these transistors. The gate insulating film GI is formed on a surface of the channel semiconductor layer CR, and the gate electrode layer GE is formed on the surface of the channel semiconductor layer CR via this gate insulating film GI. Note that the channel semiconductor layer CR may be configured by, for example, polysilicon or an oxide semiconductor (for example, InGaZnO, ZnO, InOx, and so on). Moreover, the gate insulating film GI is configured from, for example, silicon oxide (SiOx). Moreover, the gate electrode layer GE may be configured from polysilicon. A metal film of the likes of tungsten, or a stacked film of such a metal film and polysilicon, may be employed instead of polysilicon.

As shown in FIG. 5, the stepped wiring line portion SR includes wiring line layers 31a' to 31d' (second conductive layers) formed extending the first through fourth word line conductive layers 31a to 31d. That is, the wiring line layers 31a' to 31d' are formed in identical layers to, and are electrically and physically connected to the first through fourth word line conductive layers 31a to 31d. The wiring line layers 31a' to 31d' and inter-layer insulating layers 32a' to 32d' sandwiched between them are formed in steps such that positions of their ends in the X direction are different, and configure a step portion ST. The step portion ST shown specifically in FIG. 5 includes step difference portions ST1 to ST4 formed by the wiring line layers 31a' to 31d' and the inter-layer insulating layers 32a' to 32d', positions of ends of which are different in the X direction.

A contact plug C1 (third conductive layer) extends having the stacking direction (Z direction) as its longitudinal direction, from each of these step difference portions ST1 to ST4.

Figure 7:
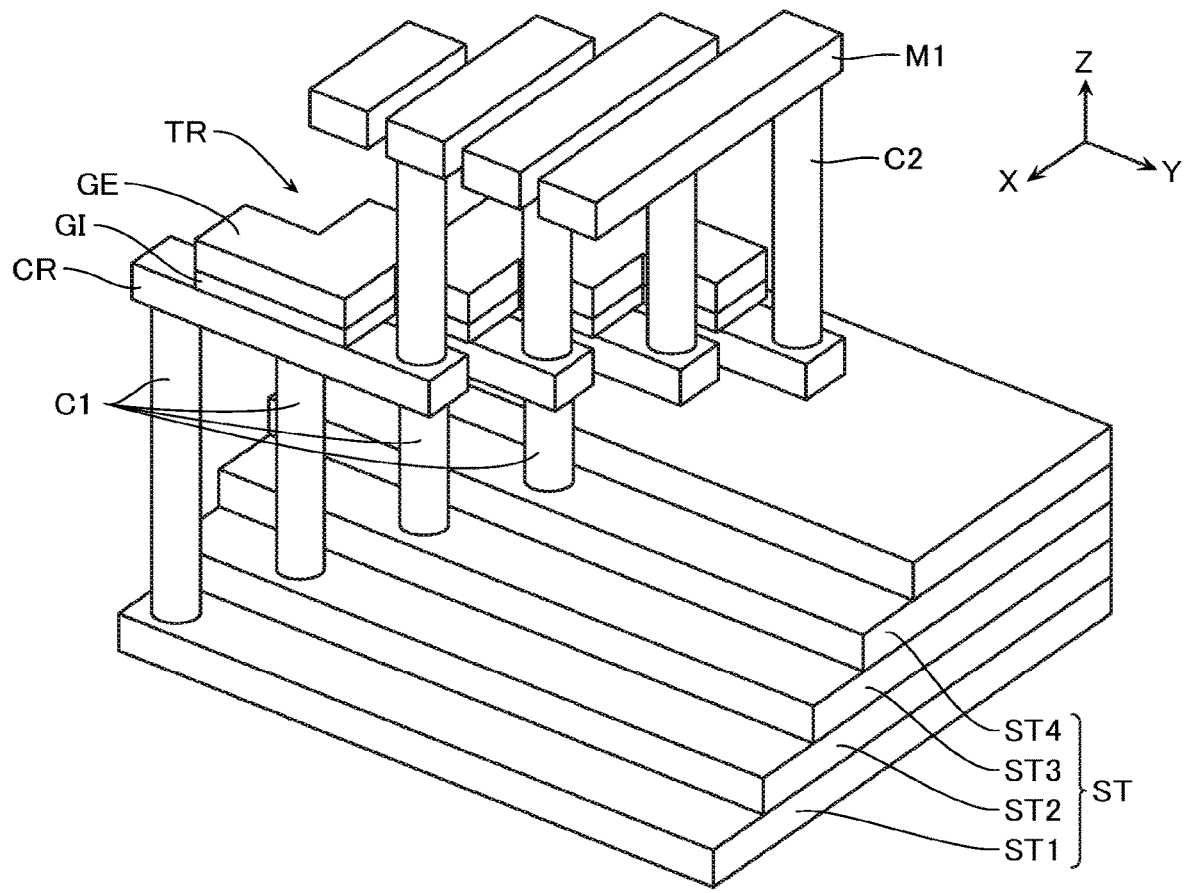
FIG. 7 is a perspective view showing a structure of a transistor TR included in a word line connection circuit SW formed in an upper portion of the stepped wiring line portion SR, of the first embodiment.
Figure 8:
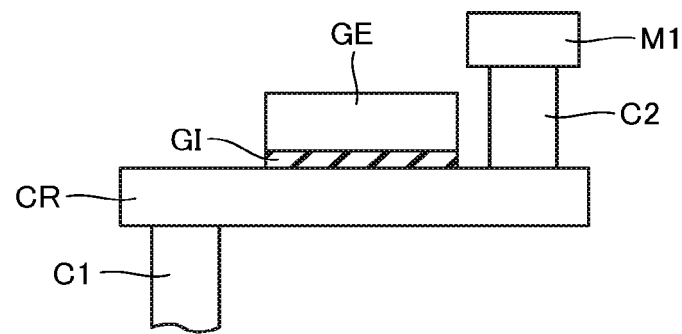
FIG. 8 is a side view of the transistor TR.
Figure 9:
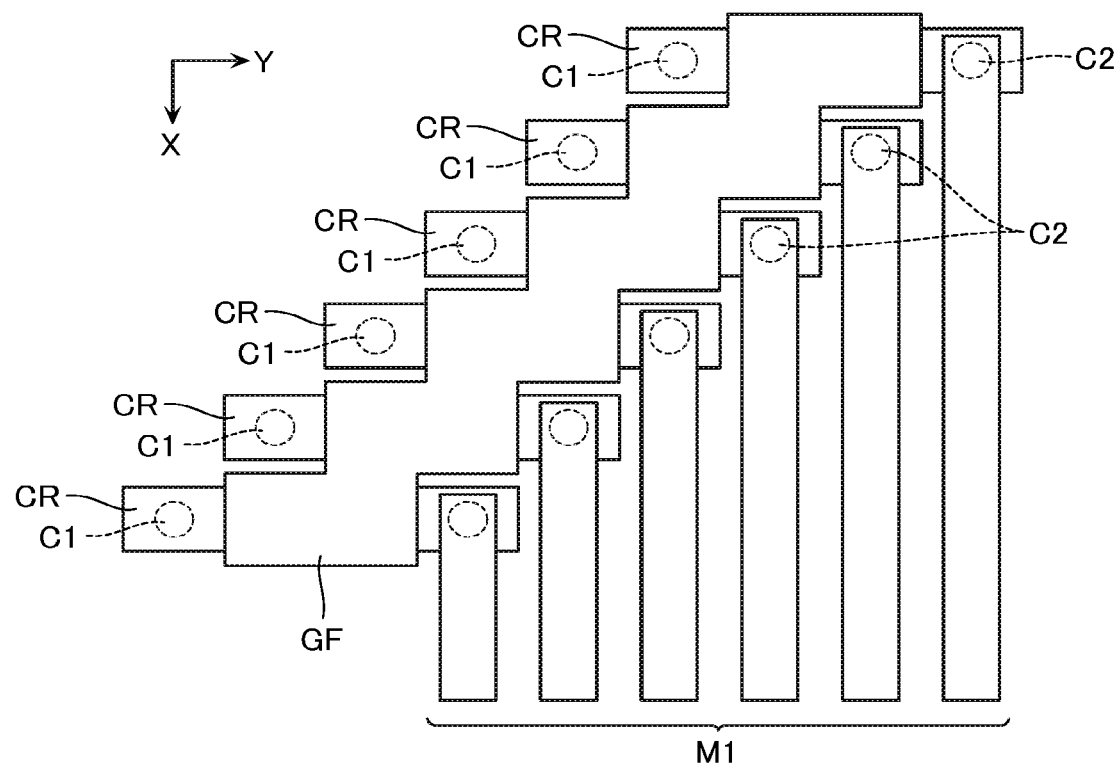
FIG. 9 is a plan view of the transistor TR.

FIG. 7 is a perspective view showing a structure of a transistor TR included in the word line connection circuit SW formed in an upper portion of the stepped wiring line portion SR. FIG. 8 is a side view of the transistor TR; moreover, FIG. 9 is a plan view of the transistor TR. Note that for simplification of illustration, FIG. 7 omits illustration of inter-layer insulating films.

As previously mentioned, the transistor TR included in the word line connection circuit SW comprises the channel semiconductor layer CR, the gate insulating film GI, and the gate electrode layer GE. These channel semiconductor layer CR, gate insulating film GI, and gate electrode layer GE result in one thin film transistor (TFT) being formed.

Although illustration thereof is omitted, the channel semiconductor layer CR is configured having, for example, an n type semiconductor layer, a p type semiconductor layer, and an n type semiconductor layer arranged in its longitudinal direction. Moreover, the gate insulating film GI and the gate electrode layer GE are deposited sequentially in a layer above the p type semiconductor layer sandwiched between the two n type semiconductor layers. Note that the channel semiconductor layer CR of this embodiment is formed along a longitudinal direction of the step difference portions ST1 to ST4. In the case of such a configuration, a multiplicity of channel semiconductor layers CR can be disposed along a shape of the step portion ST, and it becomes easy for a larger number of the transistors TR to be formed.

Moreover, as shown in FIGS. 7 and 9, the gate electrode layer GE of this embodiment is connected commonly (continuously) over a plurality of the channel semiconductor layers CR. In the illustrated example, the gate electrode layer GE is formed in a zigzag shape. However, as long as it is continuously connected over a plurality of the channel semiconductor layers CR, other shapes than the zigzag shape may also be adopted. Note that as in a later-to-be-described embodiments, the gate electrode layer GE may be formed in a separate independent form for each of the plurality of channel semiconductor layers CR.

Moreover, one end (reverse face) of the channel semiconductor layer CR is connected to an upper end of the contact plug C1. That is, the transistor TR including the channel semiconductor layer CR is disposed vertically upward of the contact plug C1.

On the other hand, the other end (surface) of the channel semiconductor layer CR is connected to a contact plug C2 separate from the contact plug C1. An upper layer wiring line M1 extending in the X direction is connected to an upper end of the contact plug C2. In the illustrated example, the upper layer wiring lines M1 are arranged having the X direction as their longitudinal direction. This upper layer wiring line M1 is connected to the row decoder RD via another contact plug or wiring line layer, in an unillustrated region.

Figure 10:
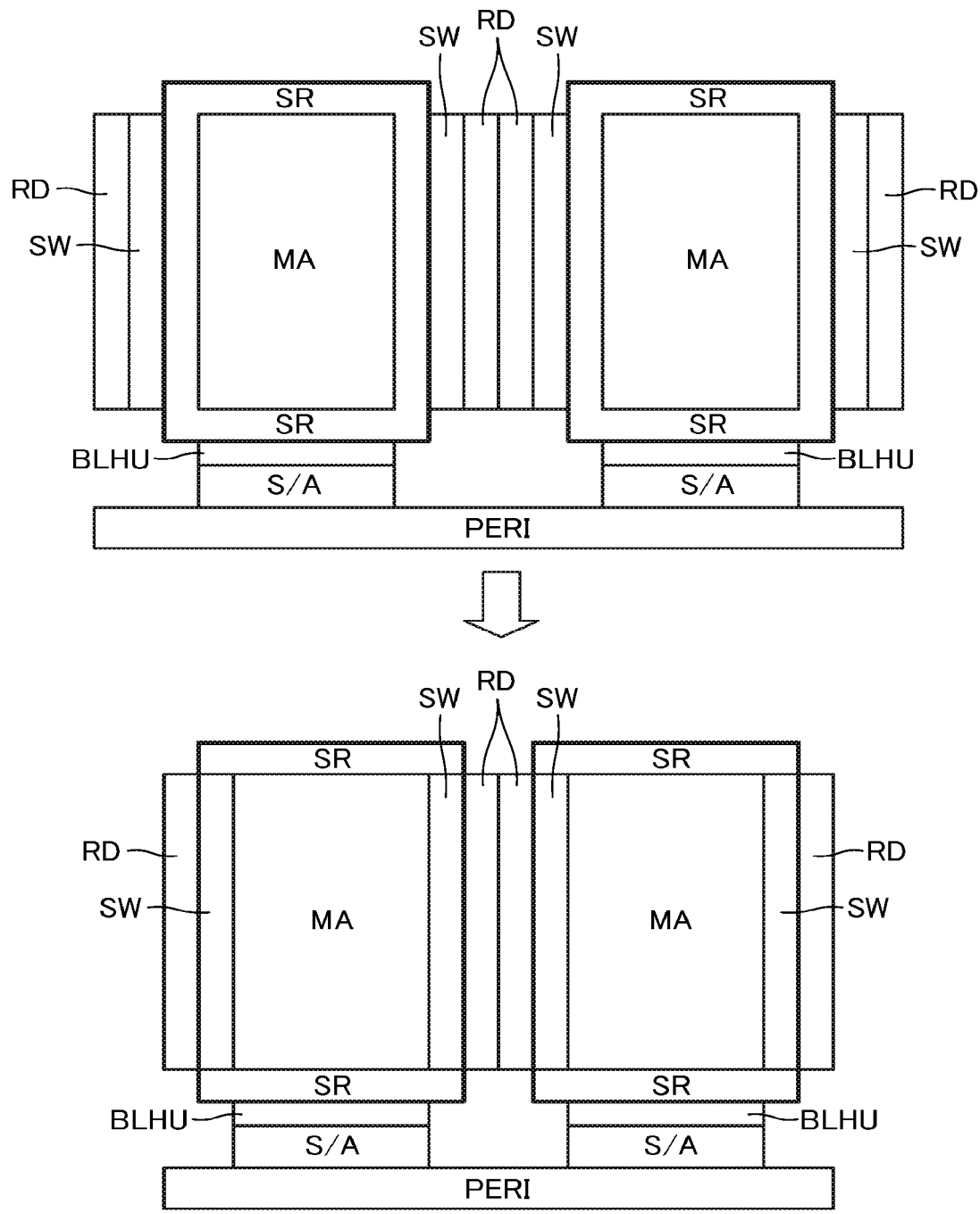
FIG. 10 shows advantages of the first embodiment.

As described above, in this embodiment, the channel semiconductor layer CR is formed directly above the step portion ST in the Z direction, and has its longitudinal direction along the longitudinal direction of the step difference portions ST1 to ST4 of the step portion ST (Y direction in the illustrated example). As a result, as shown in FIG. 10, the word line connection circuit SW can be disposed overlapping the stepped wiring line portion SR in the XY plane. Therefore, this first embodiment makes it possible to suppress an increase in area occupied by the word line connection circuit SW and reduce chip area overall.

Second Embodiment

Next, a NAND type flash memory according to a second embodiment will be described with reference to FIGS. 11A and 11B.

Figure 11A:
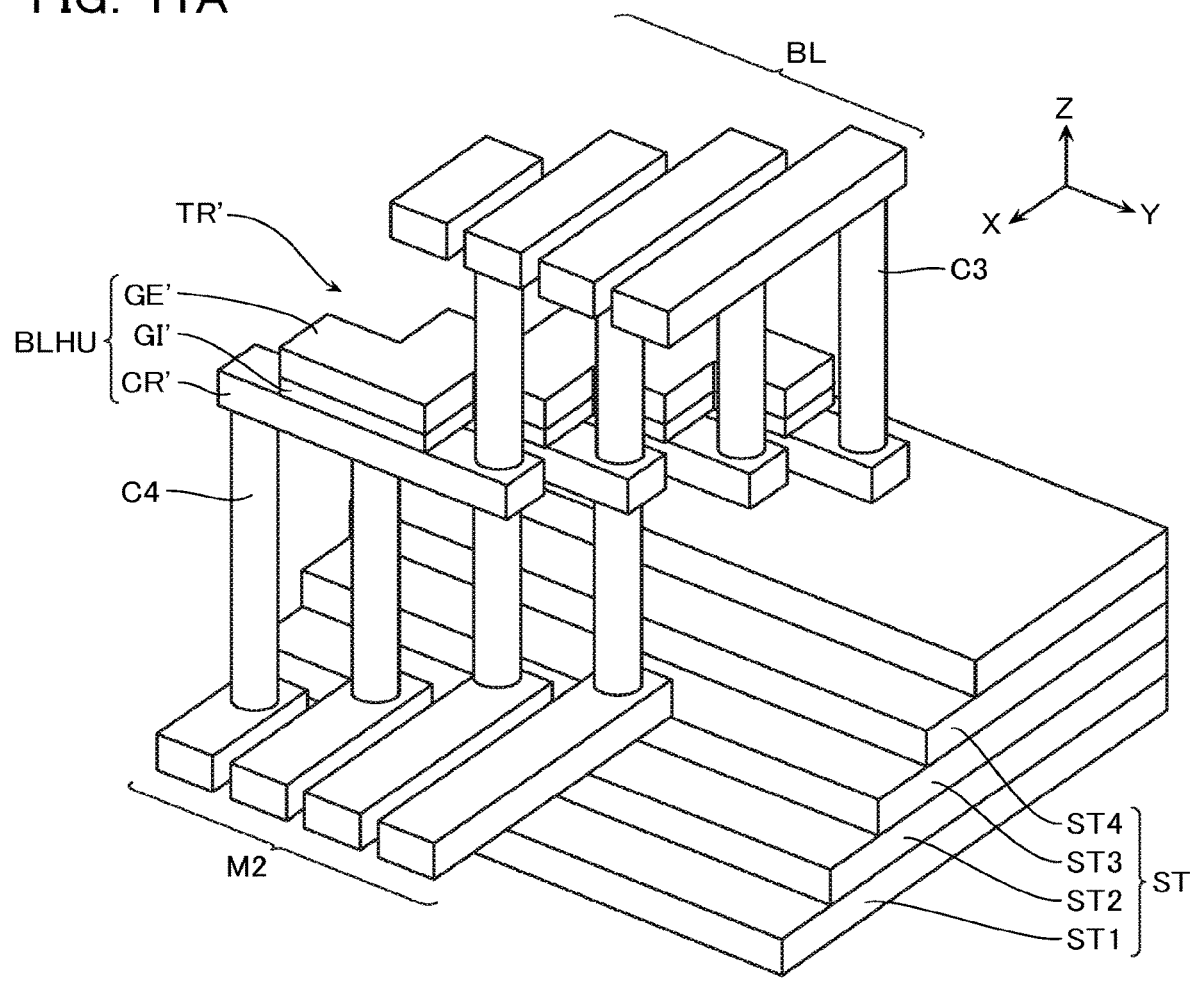
FIG. 11A is a perspective view showing a structure of a transistor TR' included in a bit line connection circuit BLHU formed in an upper portion of a stepped wiring line portion SR, of a second embodiment.

As shown in FIG. 11A, in the NAND type flash memory of this second embodiment, a transistor TR' configuring the bit line connection circuit BLHU is also formed directly above the step portion ST, similarly to the transistor TR of the word line connection circuit SW. As shown illustratively in FIG. 11B, this transistor TR' is configured from a stacked structure of a channel semiconductor layer CR', a gate insulating film GI', and a gate electrode layer GE', and its basic structure is substantially identical to that of the transistor TR. One end of this transistor TR' is connected to the bit line BL via a contact C3. Moreover, the other end of the transistor TR' is connected to a lower layer wiring line M2 via a contact C4, and is connected to the sense amplifier circuit S/A via this wiring line layer M2.

Figure 11B:
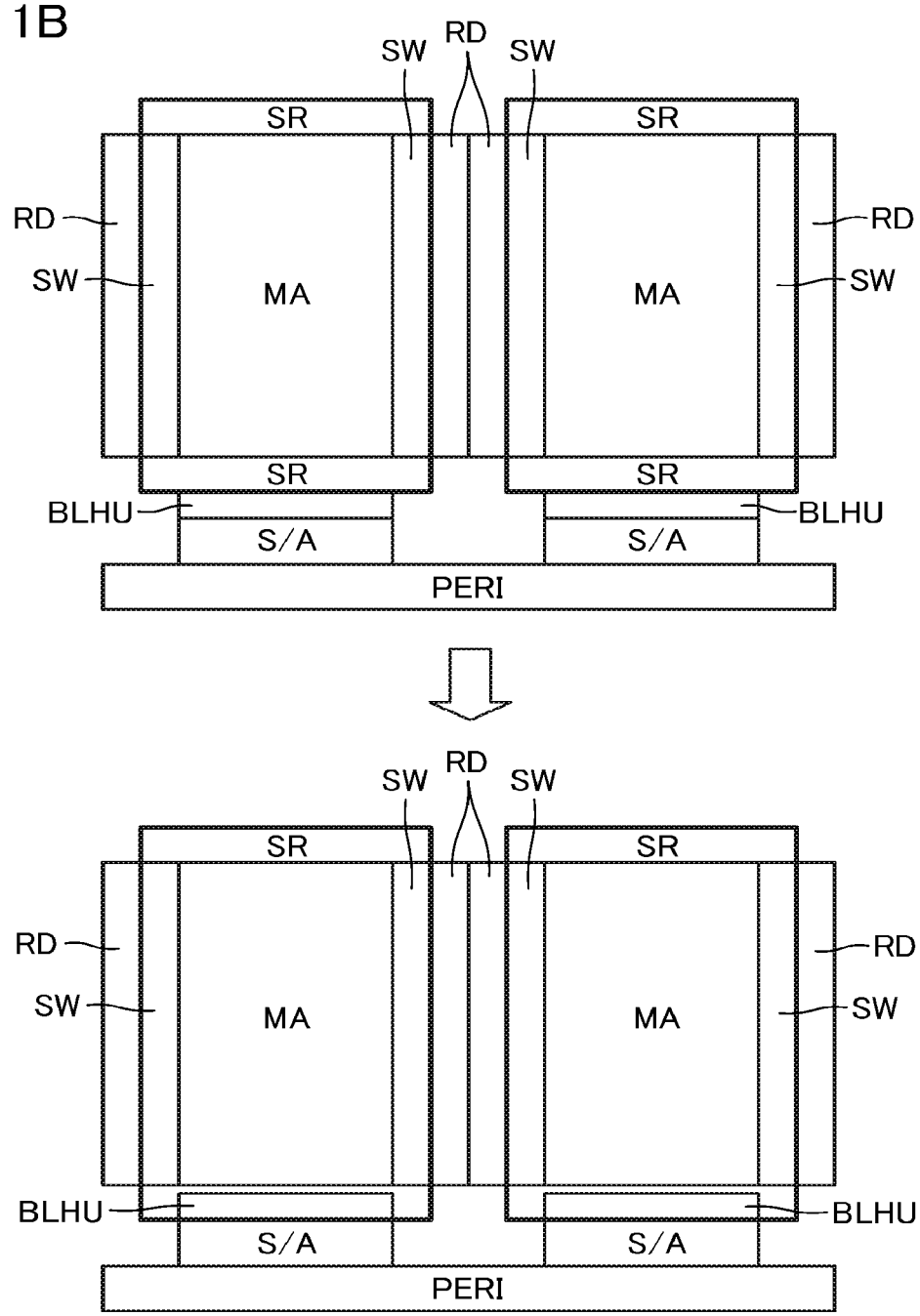
FIG. 11B shows advantages of the second embodiment.

Such a configuration makes it possible for the bit line connection circuit BLHU to be disposed overlapping the stepped wiring line portion SR in the XY plane as shown in FIG. 11B. Therefore, this second embodiment makes it possible to further reduce chip area even compared to the first embodiment. Configurations of other portions such as a structure of the memory cell array MA are identical to those of the first embodiment, hence duplicated descriptions thereof will be omitted.

Third Embodiment

Figure 12:
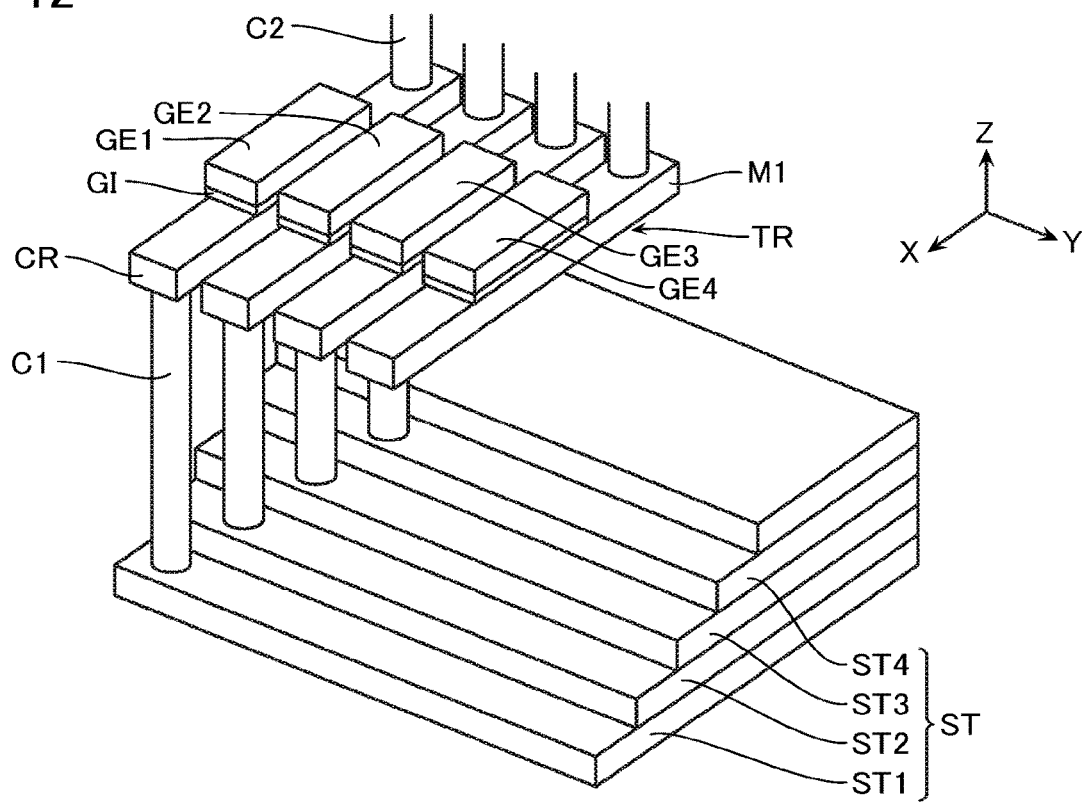
FIG. 12 is a perspective view showing a structure of a transistor TR included in a word line connection circuit SW formed in an upper portion of a stepped wiring line portion SR, of a third embodiment.

Next, a NAND type flash memory according to a third embodiment will be described with reference to FIG. 12. As shown in FIG. 12, in the NAND type flash memory of this third embodiment, a configuration of the transistor TR in the word line connection circuit SW is different to that in the first embodiment. Structures of other portions including a structure of the memory cell array MA, and so on, are identical to those of the first embodiment, hence descriptions thereof will be omitted below.

As shown in FIG. 12, the transistor TR in the word line connection circuit SW of this third embodiment comprises the channel semiconductor layer CR that extends having the X direction as its longitudinal direction. Moreover, conversely, the upper layer wiring line M1 is formed so as to extend having the Y direction as its longitudinal direction. That is, the longitudinal directions of the channel semiconductor layer CR and the upper layer wiring line M1 differ by 90° from those of the first embodiment. This embodiment also enables the word line connection circuit SW to be overlapped with the stepped wiring line portion SR in the XY plane, hence enables identical advantages to those of the first embodiment to be displayed. Note that FIG. 12 illustrates an example in which gate electrode layers GE1 to GE4 are each formed independently for each of the plurality of channel semiconductor layers CR, but it is also possible for one gate electrode layer GE to be formed commonly (continuously) on the plurality of channel semiconductor layers CR, similarly to in the first embodiment (FIG. 7).

Fourth Embodiment

Figure 13:
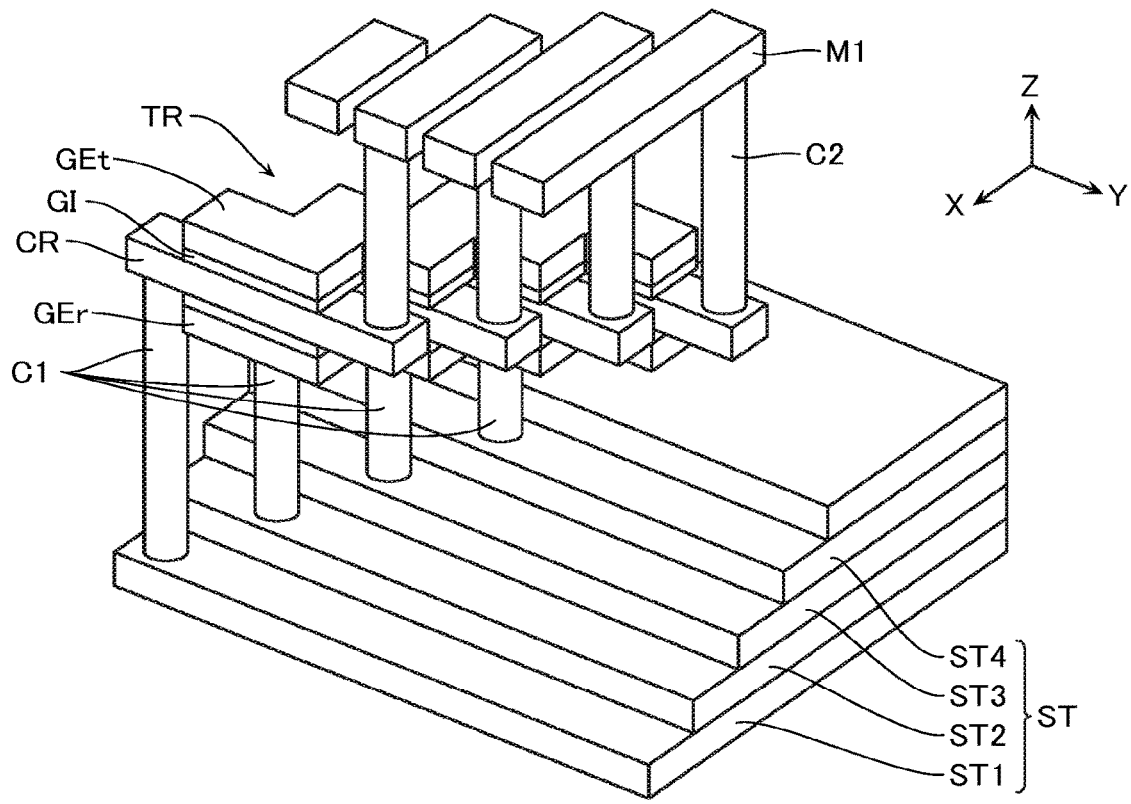
FIG. 13 is a perspective view showing a structure of a transistor TR included in a word line connection circuit SW formed in an upper portion of a stepped wiring line portion SR, of a fourth embodiment.

Next, a NAND type flash memory according to a fourth embodiment will be described with reference to FIG. 13. As shown in FIG. 13, in the NAND type flash memory of this fourth embodiment, a configuration of the transistor TR in the word line connection circuit SW is different to that in the first embodiment. Structures of other portions including a structure of the memory cell array MA, and so on, are identical to those of the first embodiment, hence descriptions thereof will be omitted below.

As shown in FIG. 13, the transistor TR in the word line connection circuit SW of this fourth embodiment, in addition to including a gate electrode layer GEt on the surface of the channel semiconductor layer CR via the gate insulating film GI, includes another gate electrode layer GEr also on the reverse face of the channel semiconductor layer CR. In this respect, the fourth embodiment differs from the first embodiment. The gate electrode layers GEt and GEr are each connected to an external circuit by separate contact plugs not illustrated.

This embodiment also enables the word line connection circuit SW to be overlapped with the stepped wiring line portion SR in the XY plane, hence enables identical advantages to those of the first embodiment to be displayed. In addition, as a result of this embodiment, the gate electrode layers GEt and GEr are provided on both of the surface and the reverse face of the channel semiconductor layer CR, hence cutoff characteristics of the transistor TR can be improved.

Fifth Embodiment

Figure 14:
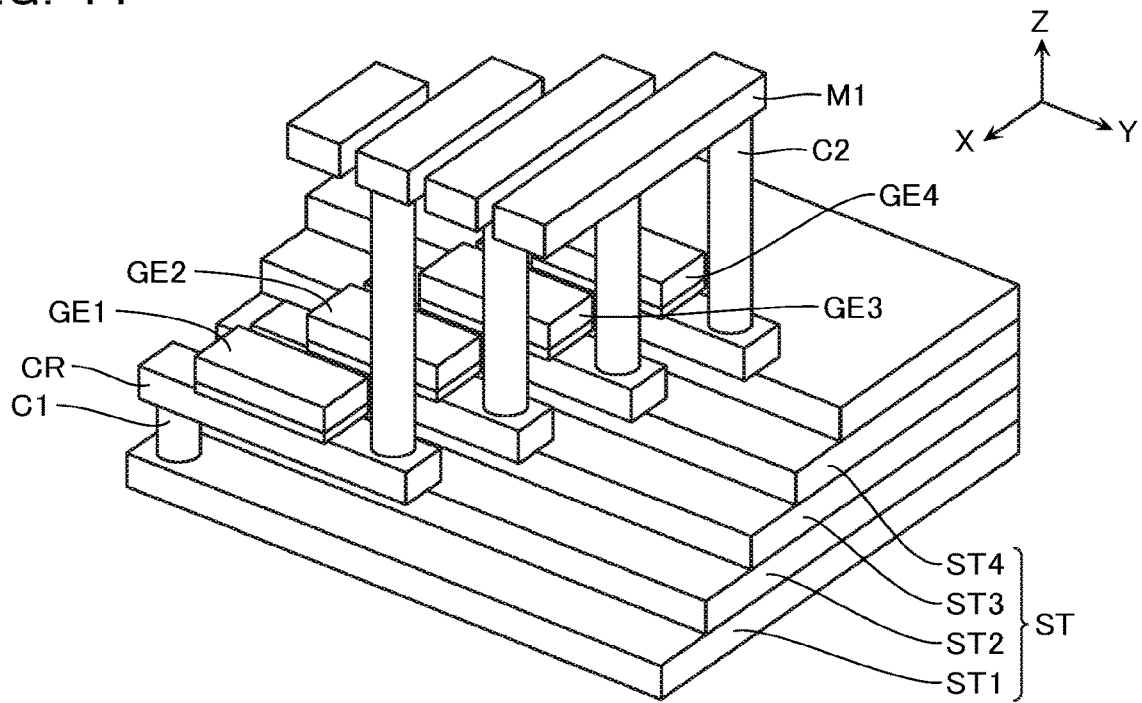
FIG. 14 is a perspective view showing a structure of a transistor TR included in a word line connection circuit SW formed in an upper portion of a stepped wiring line portion SR, of a fifth embodiment.

Next, a NAND type flash memory according to a fifth embodiment will be described with reference to FIG. 14. As shown in FIG. 14, in the NAND type flash memory of this fifth embodiment, a configuration of the transistor TR in the word line connection circuit SW is different to that in the first embodiment. Structures of other portions including a structure of the memory cell array MA, and so on, are identical to those of the first embodiment, hence descriptions thereof will be omitted below.

As shown in FIG. 14, the transistor TR in the word line connection circuit SW of this fifth embodiment includes the gate electrode layers GE1 to GE4 formed separately and independently for each of the plurality of channel semiconductor layers CR. In this respect, the fifth embodiment differs from the first embodiment in which one gate electrode layer GE is provided commonly and continuously on the plurality of channel semiconductor layers CR. The gate electrode layers GE1 to GE4 are each separately connected to different contact plugs (not illustrated) and gate-controlled. This embodiment also enables the word line connection circuit SW to be overlapped with the stepped wiring line portion SR in the XY plane, hence enables identical advantages to those of the first embodiment to be displayed.

Sixth Embodiment

Figure 15:
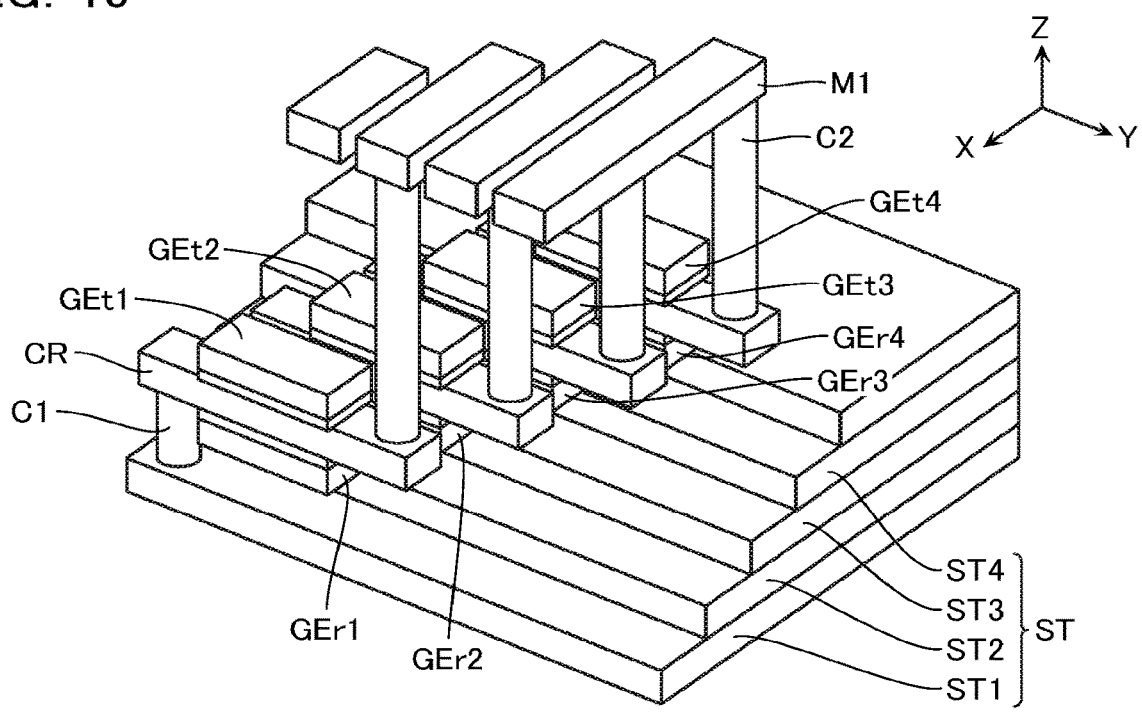
FIG. 15 is a perspective view showing a structure of a transistor TR included in a word line connection circuit SW formed in an upper portion of a stepped wiring line portion SR, of a sixth embodiment.

Next, a NAND type flash memory according to a sixth embodiment will be described with reference to FIG. 15. As shown in FIG. 15, in the NAND type flash memory of this sixth embodiment, a configuration of the transistor TR in the word line connection circuit SW is different to that in the first embodiment. Structures of other portions including a structure of the memory cell array MA, and so on, are identical to those of the first embodiment, hence descriptions thereof will be omitted below.

As shown in FIG. 15, the transistor TR in the word line connection circuit SW of this sixth embodiment includes on the surface of the channel semiconductor layer CR gate electrode layers GEt1 to GEt4 formed separately and independently for each of the plurality of channel semiconductor layers CR. In addition, gate electrode layers GEr1 to GEr4 formed separately and independently for each of the plurality of channel semiconductor layers CR are formed on the reverse face of the channel semiconductor layer CR. The gate electrode layers GEt1 to GEt4 and GEr1 to GEr4 are each separately connected to different contact plugs (not illustrated) and gate-controlled. This embodiment also enables the word line connection circuit SW to be overlapped with the stepped wiring line portion SR in the XY plane, hence enables identical advantages to those of the first embodiment to be displayed.

Seventh Embodiment

Next, a NAND type flash memory according to a seventh embodiment will be described with reference to FIGS. 16A to 16C. Structures of portions other than those shown in FIGS. 16A to 16C, including a structure of the memory cell array MA, and so on, are identical to those of the first embodiment, hence descriptions thereof will be omitted below.

Figure 16A:
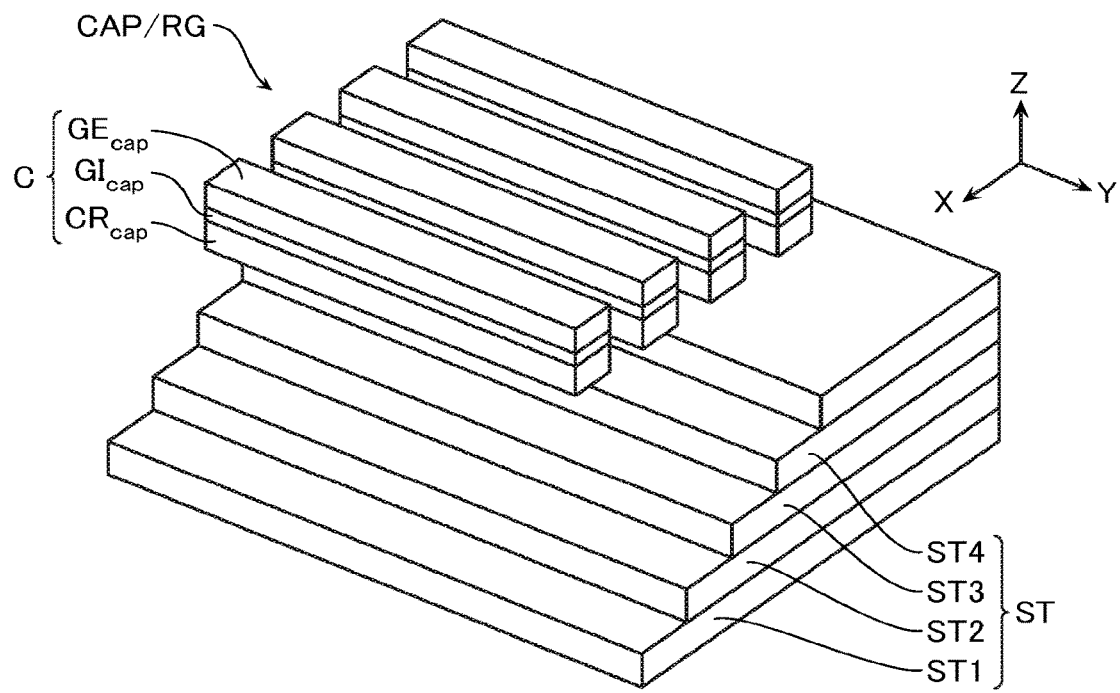
FIG. 16A is a perspective view showing a structure of a capacitor C formed in an upper portion of a stepped wiring line portion SR, of a seventh embodiment.
Figure 16B:
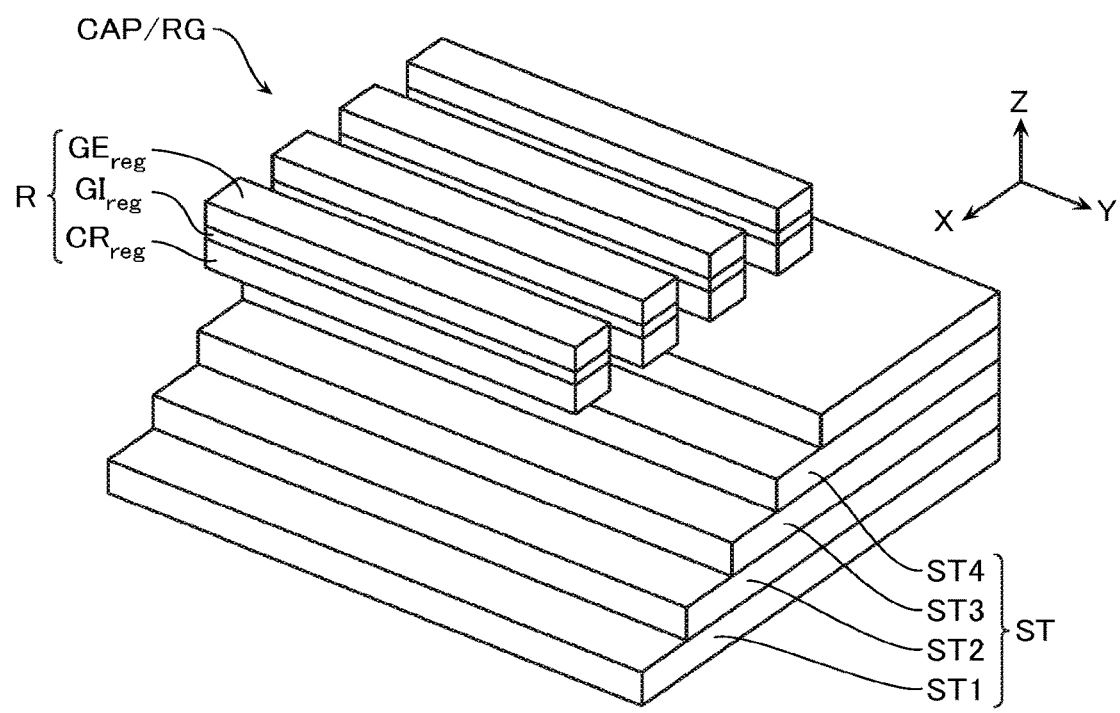
FIG. 16B is a perspective view showing a structure of the capacitor C formed in the upper portion of the stepped wiring line portion SR, of the seventh embodiment.
Figure 16C:
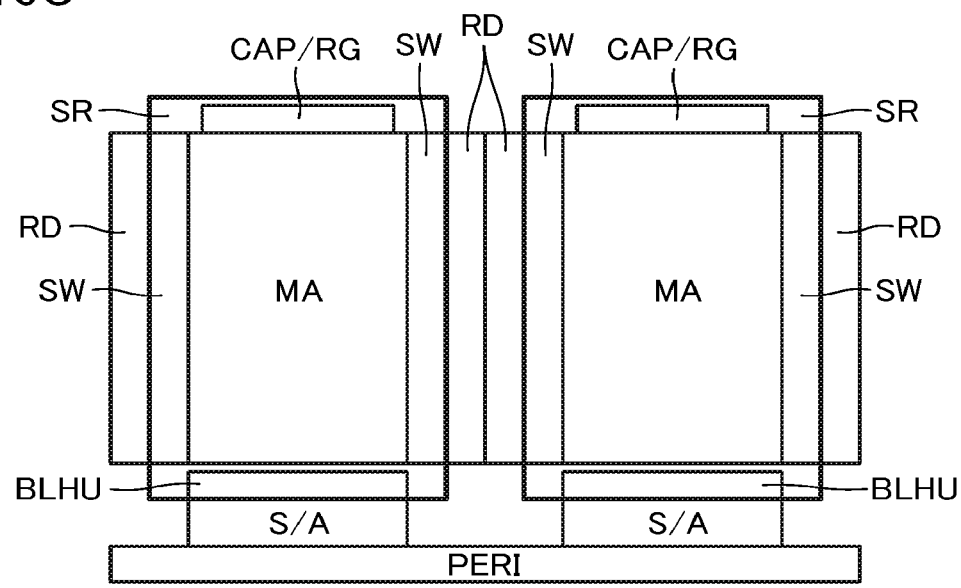
FIG. 16C explains advantages of the seventh embodiment.

As shown in FIGS. 16A and 16B, this seventh embodiment has a capacitor/resistance circuit CAP/RG disposed so as to overlap the stepped wiring line portion SR in the XY plane. In this respect, the seventh embodiment differs from the previously described embodiments.

As shown in, for example, FIG. 16A, a capacitor C configuring the capacitor/resistance circuit CAP/RG may be formed by a MIM capacitor, the MIM capacitor having stacked sequentially therein a semiconductor layer CRcap, an insulating film GIcap, and an electrode layer GEcap, as an example. The semiconductor layer CRcap, the insulating film GIcap, and the electrode layer GEcap may be formed by identical materials to, and by identical steps to the previously described channel semiconductor layer CR, gate insulating film GI, and gate electrode layer GE. Moreover, these semiconductor layer CRcap and electrode layer GEcap function as the two electrodes of the capacitor C. Note that instead of a MIM capacitor structure, it is also possible to form the capacitor C by a MOS capacitor formed by short-circuiting a source and drain of the transistor TR of the kind shown in FIG. 7.

Moreover, as shown in FIG. 16B, a resistance element R configuring the capacitor/resistance circuit CAP/RG may be formed by a resistance element that has stacked sequentially therein a semiconductor layer CRreg, an insulating film GIreg, and an electrode layer GEreg, as an example. These semiconductor layer CRreg and/or electrode layer GEreg function as a resistance portion of the resistance element R.

The capacitor/resistance circuit CAP/RG generally has a large occupied area, but adopting this configuration of the seventh embodiment makes it possible to reduce an occupied area of the peripheral circuit PERI, and as a result reduce area of a memory chip.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiments, the memory string of the NAND type flash memory adopts the semiconductor layer 35 extending linearly in the stacking direction. However, instead, it is also possible to adopt configurations like those of the above-described embodiments in a NAND type flash memory having a structure where the semiconductor layer 35 is doubled back in a U shape, for example. Moreover, the configurations of the above-described embodiments are not limited to a three-dimensional type NAND type flash memory and may be applied also to another three-dimensional memory, for example, a resistance varying memory, and so on. That is, the configurations of the above-described embodiments may be applied to a variety of forms of three-dimensionally disposed memories.

What is claimed is:

1. A nonvolatile semiconductor memory device, comprising:
    a substrate having a surface perpendicular to a first direction;
    a first structure provided in a first area and a second area above the substrate, the first area and the second area being arranged in a second direction perpendicular to the first direction; and
    a second structure provided in the first area and the second area above the first structure, wherein
    the first structure in the first area comprises:
        a plurality of first gate electrodes arranged in the first direction and extending in the second direction,
        a first semiconductor layer extending in the first direction and facing the plurality of first gate electrodes in the second direction, and
        a first gate insulating layer including a memory portion and disposed between a first gate electrode of the plurality of first gate electrodes and the first semiconductor layer;
    the second structure in the first area comprises a first wiring extending in the second direction;
    the first structure in the second area comprises:
        end portions of the plurality of first gate electrodes in the second direction, positions of the end portions in the second direction being different from each other, and
        a first contact extending in the first direction and having a first end portion and a second end portion in the first direction, the first end portion being connected to one of the end portions of the first gate electrodes;
    the second structure in the second area includes a transistor including a second semiconductor layer, a second gate insulating layer on the second semiconductor layer, and a second gate electrode on the second gate insulating layer stacked in the first direction;
    the second gate electrode is positioned above the first wiring in the first direction;
    a lower surface of the second semiconductor layer is connected to the second end portion of the first contact;
    the second semiconductor layer extends in the second direction; and
    a current path of a channel area of the second semiconductor layer is along the second direction.

2. The memory device according to claim 1, wherein the first wiring is disposed at least upwardly of the memory portion.

3. The memory device according to claim 1, wherein the second semiconductor layer is overlapped with the first contact if the second semiconductor layer is viewed from the first direction.

4. The memory device according to claim 1, wherein the lower surface of the second semiconductor layer and a lower surface of the first wiring are positioned in a same level of the nonvolatile semiconductor memory device.

5. The memory device according to claim 1, wherein the first wiring extends in a third direction perpendicular to the first direction and the second direction.

6. The memory device according to claim 1, further comprising:
    a plurality of the first contacts; and
    a plurality of the transistors connected to the plurality of the first contacts, wherein
    the plurality of the first contacts have different positions in the second direction from each other and have different positions in a third second direction from each other, the third direction being perpendicular to the first direction and the second direction.

7. The memory device according to claim 1, wherein the first contact has:
    the first end portion in the first direction contacting the one of the end portions of the first gate electrodes; and
    the second end portion in the first direction contacting the lower surface of the second semiconductor layer.

* * * * *